(12) United States Patent
Do et al.

(10) Patent No.: US 8,623,708 B1
(45) Date of Patent: Jan. 7, 2014

(54) INTEGRATED CIRCUIT PACKAGING SYSTEM WITH GRID-ARRAY MECHANISM AND METHOD OF MANUFACTURE THEREOF

(75) Inventors: Byung Tai Do, Singapore (SG); Arnel Senosa Trasporto, Singapore (SG); Linda Pei Ee Chua, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 13/542,120

(22) Filed: Jul. 5, 2012

(51) Int. Cl.
*H01L 21/44* (2006.01)
*H01L 21/48* (2006.01)

(52) U.S. Cl.
USPC ........... 438/123; 438/108; 438/124; 438/127; 438/613; 257/666; 257/E21.51

(58) Field of Classification Search
USPC .......... 438/123, 108, 124, 127, 613; 257/666, 257/E21.51
See application file for complete search history.

(56) References Cited

U.S. PATENT DOCUMENTS

| | | | | |
|---|---|---|---|---|
| 6,953,988 B2* | 10/2005 | Seo et al. | | 257/666 |
| 7,026,192 B2* | 4/2006 | Minamio et al. | | 438/123 |
| 7,638,879 B2* | 12/2009 | Jiang et al. | | 257/766 |
| 8,084,299 B2* | 12/2011 | Tan et al. | | 438/111 |
| 8,338,924 B2* | 12/2012 | McMillan et al. | | 257/666 |
| 2004/0070074 A1* | 4/2004 | Sakamoto et al. | | 257/734 |
| 2011/0070074 A1* | 3/2011 | Schabowski et al. | | 415/174.5 |
| 2011/0079888 A1* | 4/2011 | Bathan et al. | | 257/676 |
| 2011/0278707 A1* | 11/2011 | Chi et al. | | 257/676 |
| 2011/0279707 A1* | 11/2011 | Oozeki | | 348/229.1 |
| 2012/0074548 A1* | 3/2012 | Camacho et al. | | 257/676 |

OTHER PUBLICATIONS

U.S. Appl. No. 13/102,041, filed May 5, 2011, Do et al.
U.S. Appl. No. 13/326,806, filed Dec. 15, 2011, Do et al.
U.S. Appl. No. 13/425,286, filed Mar. 20, 2012, Do et al.
U.S. Appl. No. 13/427,598, filed Mar. 22, 2012, Do et al.

* cited by examiner

*Primary Examiner* — Nitin Parekh
(74) *Attorney, Agent, or Firm* — Ishimaru & Associates LLP (57) ABSTRACT

A method of manufacture of an integrated circuit packaging system includes providing a lead-frame having an inner portion and a bottom cover directly on a bottom surface of the inner portion; forming an insulation cover directly on the lead-frame with the insulation cover having a connection opening; connecting an integrated circuit die to the lead-frame through the connection opening with the integrated circuit die over the insulation cover; forming a top encapsulation directly on the insulation cover; forming a routing layer having a conductive land directly on the bottom cover by shaping the lead-frame; and forming a bottom encapsulation directly on the conductive land with the bottom cover exposed from the bottom encapsulation.

5 Claims, 4 Drawing Sheets

INTEGRATED CIRCUIT PACKAGING SYSTEM WITH GRID-ARRAY MECHANISM AND METHOD OF MANUFACTURE THEREOF

TECHNICAL FIELD

The present invention relates generally to an integrated circuit packaging system, and more particularly to a system having a grid-array.

BACKGROUND ART

Increased miniaturization of components, greater packaging density of integrated circuits ("ICs"), higher performance, and lower cost are ongoing goals of the computer industry. Semiconductor packaging structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, IC packages that are incorporated into these devices are required to be made smaller and thinner. The packaging configurations that house and protect IC require them to be made smaller and thinner as well.

Thus, a need still remains for an integrated circuit packaging system with lead-frame grid-array mechanism providing low cost manufacturing, improved yields, reduction of integrated circuit packaging dimensions, and flexible stacking and integration configurations. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a lead-frame having an inner portion and a bottom cover directly on a bottom surface of the inner portion; forming an insulation cover directly on the lead-frame with the insulation cover having a connection opening; connecting an integrated circuit die to the lead-frame through the connection opening with the integrated circuit die over the insulation cover; forming a top encapsulation directly on the insulation cover; forming a routing layer having a conductive land directly on the bottom cover by shaping the lead-frame; and forming a bottom encapsulation directly on the conductive land with the bottom cover exposed from the bottom encapsulation.

The present invention provides an integrated circuit packaging system including: a routing layer having a conductive land directly on a bottom cover, with the routing layer formed by shaping a lead-frame; an insulation cover having a connection opening directly on the routing layer; an integrated circuit die connected to the routing layer through the connection opening and over the insulation cover; a top encapsulation directly on the insulation cover; and a bottom encapsulation directly on the conductive land with the bottom cover exposed from the bottom encapsulation.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. The depictions in the FIGs. are arbitrary for the most part. Generally, the invention can be operated in any orientation. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane of an active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct physical contact between elements. The term "directly on" means there is direct physical contact between elements with no intervening elements. The term "processing" as used herein includes deposition of material, patterning, exposure, development, etching, cleaning, molding, and/or removal of the material or as required in forming a described structure.

Figure 1:
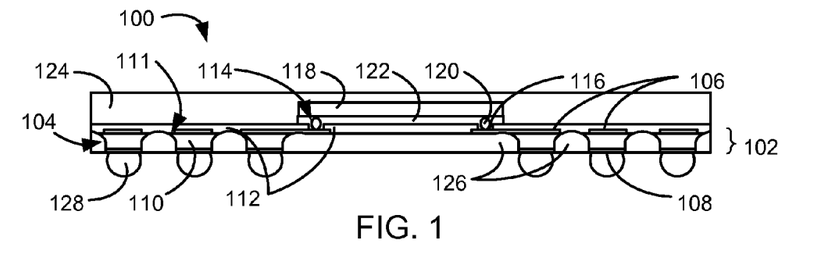
FIG. 1 is a cross-sectional view of an integrated circuit packaging system along a line 1-1 of FIG. 2 in a first embodiment of the present invention.
Figure 2:
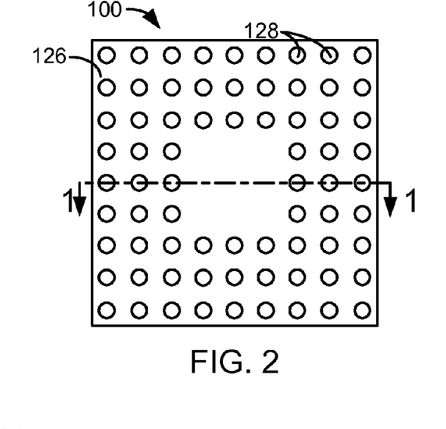
FIG. 2 is a bottom view of the integrated circuit packaging system.

Referring now to FIG. 1, therein is shown a cross-sectional view of an integrated circuit packaging system 100 along a line 1-1 of FIG. 2 in a first embodiment of the present invention. The integrated circuit packaging system 100 includes a routing layer 102.

The routing layer 102 is defined as a conductive structures used for routing electrical signals, power, ground, or reference potential for the integrated circuit packaging system 100. The routing layer 102 can route the signals within the integrated circuit packaging system 100, between the integrated circuit packaging system 100 and external components or structures, or a combination thereof. The routing layer 102 can have a conductive land 104 and a metal connector 106.

The conductive land 104 is defined as a conductive portion within the routing layer 102 for routing electrical signals, power, ground or any reference potential in a non-horizontal direction. The conductive land 104 can be located on a lower portion of the integrated circuit packaging system 100. The conductive land 104 can extend in a non-horizontal direction. The conductive land 104 can have a bottom cover 108 and a column portion 110.

The bottom cover 108 is defined as an electrically conductive material for interfacing with components or structures external to the integrated circuit packaging system 100. The bottom cover 108 can be directly on a bottom portion of the column portion 110. The bottom cover 108 can also be used to shape and form the conductive land 104. The manufacturing process of the integrated circuit packaging system 100, including shaping and forming of the conductive land 104 will be discussed in more detail below.

The column portion 110 can be made from any number of materials. For example, the column portion 110 can be made from metal, such as copper or aluminum, or an alloy. The column portion 110 can be electrically conductive. The column portion 110 can have a non-horizontal wall connected to a top surface of the column portion 110 or an overhang portion 111 located at a top portion of the column portion 110. The non-horizontal wall and the overhang portion 111 of the column portion 110 can join to form an angle or a concave curve and to provide mold locking features.

For example, the overhang portion 111 can have the top surface of the column portion 110 extending past the non-horizontal wall of the column portion. The top surface and the bottom surface of the overhang portion 111 can join and form an acute or a right angle. The bottom surface of the overhang portion 111 can extend to and be integral with the non-horizontal wall. The bottom surface of the overhang portion 111 can form an obtuse or a right angle with the non-horizontal wall. The bottom surface of the overhang portion 111 can also form a concaved curved surface with the non-horizontal wall.

The metal connector 106 can be directly on a top portion of the conductive land 104. The metal connector 106 can be conductive and extend horizontally for routing electrical signals along a horizontal plane. For example, the metal connector 106 can connect the conductive land 104, another component or structure within the integrated circuit packaging system 100, or a combination thereof. Also, for example, the metal connector 106 can be a trace, a wire, a pad, a connector, or a combination thereof.

The integrated circuit packaging system 100 can have an insulation cover 112. The insulation cover 112 is defined as a non-conductive material for covering the routing layer 102. For example, the insulation cover 112 can be ceramic, solder resist, dielectric structure, or a combination thereof. The insulation cover 112 can be directly on the routing layer 102. The insulation cover 112 can selectively expose only portions of the routing layer 102 necessary for electrically connecting to other components or structures.

The insulation cover 112 can be directly on a top or side portion of the metal connector 106, a top or side portion of the conductive land 104, or a combination thereof. The insulation cover 112 can extend horizontally and over the metal connector 106, the conductive land 104, or a combination thereof. The insulation cover 112 can cover the top portion of the metal connector 106, the top portion of the conductive land 104, or a combination thereof.

The insulation cover 112 can have a connection opening 114 for selectively connecting components or structures to the metal connector 106, the conductive land 104, or a combination thereof. The connection opening 114 of the insulation cover 112 can expose the metal connector 106, the conductive land 104, or a combination thereof from the insulation cover 112. The insulation cover 112 can partially or completely cover the top portion of the metal connector 106, the top portion of the conductive land 104, or a combination thereof.

The routing layer 102 can have a connection enhancer 116, such as a solder wetable material, in the connection opening 114. The connection enhancer 116 can be on the top portion of the metal connector 106, the top portion of the conductive land 104, or a combination thereof. The connection enhancer 116 can be only on the portions of the metal connector 106, the conductive land 104, or a combination thereof exposed by the connection opening 114.

The integrated circuit packaging system 100 can have an integrated circuit die 118, such as a wire bond die or a flip chip, connected to the metal connector 106 through an internal interconnect 120, such as a bond wire or a solder bump. The integrated circuit die 118 can be attached on the insulation cover 112 and can be over the insulation cover 112, the metal connector 106, the conductive land 104, or a combination thereof. The internal interconnect 120 can be in the connection opening 114 and directly on the integrated circuit die 118, the metal connector 106, the conductive land 104, or a combination thereof.

The integrated circuit packaging system 100 can have an under-fill 122, such as a capillary or a mold type. The under-fill 122 can be between, directly on, or a combination thereof for the integrated circuit die 118, the internal interconnect 120, the insulation cover 112, the metal connector 106, the conductive land 104, or a combination thereof. The under-fill 122 can also be in the connection opening 114.

The integrated circuit packaging system 100 can have a top encapsulation 124, a bottom encapsulation 126, and an external interconnect 128. The top encapsulation 124 can be over, encapsulate, be directly on, or a combination thereof for the integrated circuit die 118, the internal interconnect 120, the under-fill 122, the insulation cover 112, or a combination thereof. The bottom encapsulation 126 can be under the integrated circuit die 118.

The bottom encapsulation 126 can encapsulate and be directly on the conductive land 104 and can be between multiple instances of the conductive land 104. A bottom surface of the bottom encapsulation 126 can be coplanar with a bottom surface of the conductive land 104. The bottom surface of the bottom encapsulation 126 can also be lower than the bottom surface of the conductive land 104 and have the conductive land 104, the bottom cover 108, or a combination thereof in an indentation of the bottom encapsulation 126.

The top encapsulation 124 and the bottom encapsulation 126 can be formed separately at different times during the manufacturing process. The insulation cover 112, the metal connector 106, the conductive land 104, or a combination thereof can form a continuous horizontal plane between the top encapsulation 124 and the bottom encapsulation 126, and isolate the two encapsulation structures.

The integrated circuit packaging system 100 can have the routing layer 102 formed from a lead-frame and not a substrate structure. For example, the integrated circuit packaging system 100 can be without an inner support portion, such as such as a pre-impregnated layer in substrates, or have the routing layer 102 directly on both the insulation cover 112 and the bottom encapsulation 126.

The external interconnect 128 can be a conductive structure for electrically coupling the integrated circuit packaging system 100 to other structures, such as components or other packages. For example, the external interconnect 128 can be a solder ball, conductive posts, lands, or a combination thereof. The external interconnect 128 can be directly on the bottom portion of the conductive land 104.

It has been discovered that the insulation cover 112 directly on the routing layer 102 having the conductive land 104 without any inner support portions, such as the pre-impregnated layer in substrates, provides increased versatility while improving yield and manufacturing cost. The insulation cover 112 directly on the routing layer 102 having the conductive land 104 without any inner support portions enables using lead frames having signal routing mechanisms to manufacture lead-frame grid-array types of packages. The insulation cover 112 further provides protection against shorts and damages to the conductive portions.

It has been further discovered that the insulation cover 112 having the connection opening 114 over the routing layer 102 formed from the lead-frame and not the substrate structure provides improved yield and lower manufacturing cost. The insulation cover 112 having the connection opening 114 reduces the manufacturing complexity and material necessary to provide protection against shorts and damages to the conductive portions for lead-frames. It has yet further been discovered that the insulation cover 112 having the connection opening 114 only directly under the internal interconnect 120 provides complete protection of the routing layer 102 while maintaining lower manufacturing cost.

It has also been discovered that the conductive land 104 having the overhang portion 111 on the top portion thereof provides improved mold lock capability for the routing layer 102 while maintaining lower manufacturing cost. The overhang portion 111 on the top portion of the conductive land 104 can be a characteristic of shaping the conductive land 104 from the bottom side only instead of from both top and the bottom. The single direction of shaping eliminates the need to separately design the shaping process from an addition direction.

Referring now to FIG. 2, therein is shown a bottom view of the integrated circuit packaging system 100. The integrated circuit packaging system 100 can have instances of the conductive land 104 of FIG. 1 and the external interconnect 128 arranged in along a straight line. The integrated circuit packaging system 100 can also have instances of the conductive land 104 and the external interconnect 128 arranged in a shape of an oval or a rectangle, or in multiple concentric ovals or rectangles. The arrangement of the conductive land 104 and the external interconnect 128 can also be customized for the integrated circuit packaging system 100.

It has been discovered that the conductive land 104, the metal connector 106 of FIG. 1, and the insulation cover 112 of FIG. 1 allow increased design versatility while improving yield and manufacturing cost. The conductive land 104 and the metal connector 106 can be arranged to physically route the signals anywhere, while the insulation cover 112 can provide protection and stability to the conductive land 104 and the metal connector 106 within the integrated circuit packaging system 100.

The integrated circuit packaging system 100 can also have the bottom portion of the conductive land 104 exposed between the bottom encapsulation 126 and the external interconnect 128. The external interconnect 128, the bottom encapsulation 126, or a combination thereof can also fully cover the bottom portion of the conductive land 104.

Figure 3:
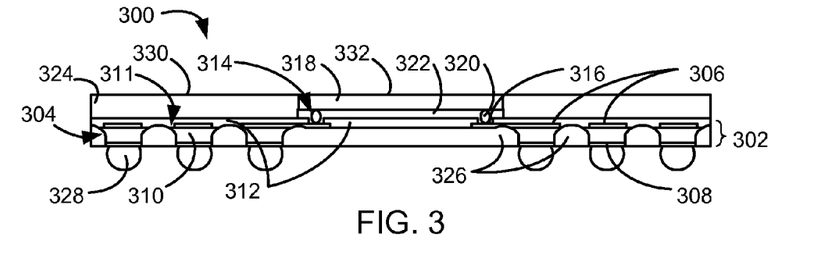
FIG. 3 is a cross-sectional view of an integrated circuit packaging system along a line 1-1 of FIG. 2 in a second embodiment of the present invention.

Referring now to FIG. 3, therein is shown a cross-sectional view of an integrated circuit packaging system 300 along a line 1-1 of FIG. 2 in a second embodiment of the present invention. The integrated circuit packaging system 300 includes a routing layer 302.

The routing layer 302 is defined as a conductive structure used for routing electrical signals, power, ground, or reference potential for the integrated circuit packaging system 300. The routing layer 302 can route the signals within the integrated circuit packaging system 300, between the integrated circuit packaging system 300 and external components or structures, or a combination thereof. The routing layer 302 can have a conductive land 304 and a metal connector 306.

The conductive land 304 is defined as a conductive portion within the routing layer 302 for routing electrical signals, power, ground or any reference potential in a non-horizontal direction. The conductive land 304 can be located on a lower portion of the integrated circuit packaging system 300. The conductive land 304 can extend in a non-horizontal direction. The conductive land 304 can have a bottom cover 308 and a column portion 310.

The bottom cover 308 is defined as an electrically conductive material for interfacing with components or structures external to the integrated circuit packaging system 300. The bottom cover 308 can be directly on a bottom portion of the column portion 310. The bottom cover 308 can also be used to shape and form the conductive land 304. The manufacturing process of the integrated circuit packaging system 300, including shaping and forming of the conductive land 304 will be discussed in more detail below.

The column portion 310 can be made from any number of materials. For example, the column portion 310 can be made from metal, such as copper or aluminum, or an alloy. The column portion 310 can be electrically conductive. The column portion 310 can have a non-horizontal wall connected to a top surface of the column portion 310 or an overhang portion 311 located at a top portion of the column portion 310. The non-horizontal wall and the overhang portion 311 of the column portion 310 can join to form an angle or a concave curve and to provide mold locking features.

For example, the overhang portion 311 can have the top surface of the column portion 310 extending past the non-horizontal wall of the column portion. The top surface and the bottom surface of the overhang portion 311 can join and form an acute or a right angle. The bottom surface of the overhang portion 311 can extend to and be integral with the non-horizontal wall. The bottom surface of the overhang portion 311 can form an obtuse or a right angle with the non-horizontal wall. The bottom surface of the overhang portion 311 can also form a concaved curved surface with the non-horizontal wall.

The metal connector 306 can be directly on a top portion of the conductive land 304. The metal connector 306 can be conductive and extend horizontally for routing electrical signals along a horizontal plane. For example, the metal connector 306 can connect the conductive land 304, another component or structure within the integrated circuit packaging system 300, or a combination thereof. Also, for example, the metal connector 306 can be a trace, a wire, a pad, a connector, or a combination thereof.

The integrated circuit packaging system 300 can have an insulation cover 312. The insulation cover 312 is defined as a non-conductive material for covering the routing layer 302. For example, the insulation cover 312 can be ceramic, solder resist, dielectric structure, or a combination thereof. The insulation cover 312 can be directly on the routing layer 302. The insulation cover 312 can selectively expose only portions of the routing layer 302 necessary for electrically connecting to other components or structures.

The insulation cover 312 can be directly on a top or side portion of the metal connector 306, a top or side portion of the conductive land 304, or a combination thereof. The insulation cover 312 can extend horizontally and over the metal connector 306, the conductive land 304, or a combination thereof. The insulation cover 312 can cover the top portion of the metal connector 306, the top portion of the conductive land 304, or a combination thereof.

The insulation cover 312 can have a connection opening 314 for selectively connecting components or structures to the metal connector 306, the conductive land 304, or a combination thereof. The connection opening 314 of the insulation cover 312 can expose the metal connector 306, the conductive land 304, or a combination thereof from the insulation cover 312. The insulation cover 312 can otherwise partially or completely cover the top portion of the metal connector 306, the top portion of the conductive land 304, or a combination thereof.

The routing layer 302 can have a connection enhancer 316, such as a solder wetable material, in the connection opening 314. The connection enhancer 316 can be on the top portion of the metal connector 306, the top portion of the conductive land 304, or a combination thereof. The connection enhancer 316 can be only on the portions of the metal connector 306, the conductive land 304, or a combination thereof exposed by the connection opening 314.

The integrated circuit packaging system 300 can have an integrated circuit die 318, such as a wire bond die or a flip chip, connected to the metal connector 306 through an internal interconnect 320, such as a bond wire or a solder bump. The integrated circuit die 318 can be attached on the insulation cover 312 and can be over the insulation cover 312, the metal connector 306, the conductive land 304, or a combination thereof. The internal interconnect 320 can be in the connection opening 314 and directly on the integrated circuit die 318, the metal connector 306, the conductive land 304, or a combination thereof.

The integrated circuit packaging system 300 can have an under-fill 322, such as a capillary or a mold type. The under-fill 322 can be between, directly on, or a combination thereof for the integrated circuit die 318, the internal interconnect 320, the insulation cover 312, the metal connector 306, the conductive land 304, or a combination thereof. The under-fill 322 can also be in the connection opening 314.

The integrated circuit packaging system 300 can have a top encapsulation 324, a bottom encapsulation 326, and an external interconnect 328. The top encapsulation 324 can be over, encapsulate, be directly on, or a combination thereof for the integrated circuit die 318, the internal interconnect 320, the under-fill 322, the insulation cover 312, or a combination thereof. The bottom encapsulation 326 can be under the integrated circuit die 318.

The bottom encapsulation 326 can encapsulate and be directly on the conductive land 304 and can be between multiple instances of the conductive land 304. A bottom surface of the bottom encapsulation 326 can be coplanar with a bottom surface of the conductive land 304. The bottom surface of the bottom encapsulation 326 can also be lower than the bottom surface of the conductive land 304 and have the conductive land 304, the bottom cover 308, or a combination thereof in an indentation of the bottom encapsulation 326.

The top encapsulation 324 and the bottom encapsulation 326 can be formed separately at different times during the manufacturing process. The insulation cover 312, the metal connector 306, the conductive land 304, or a combination thereof can form a continuous horizontal plane between the top encapsulation 324 and the bottom encapsulation 326, and isolate the two encapsulation structures.

The integrated circuit packaging system 300 can have the routing layer 302 formed from a lead-frame and not a substrate structure. For example, the integrated circuit packaging system 300 can be without an inner support portion, such as such as a pre-impregnated layer in substrates, or have the routing layer 302 directly on both the insulation cover 312 and the bottom encapsulation 326.

The external interconnect 328 can be a conductive structure for electrically coupling the integrated circuit packaging system 300 to other structures, such as components or other packages. For example, the external interconnect 328 can be a solder ball, conductive posts, lands, or a combination thereof. The external interconnect 328 can be directly on the bottom portion of the conductive land 304.

It has been discovered that the insulation cover 312 directly on the routing layer 302 having the conductive land 304 without any inner support portions, such as the pre-impregnated layer in substrates, provides increased versatility while improving yield and manufacturing cost. The insulation cover 312 directly on the routing layer 302 having the conductive land 304 without any inner support portions enables using lead frames having signal routing mechanisms to manufacture lead-frame grid-array types of packages. The insulation cover 312 further provides protection against shorts and damages to the conductive portions.

It has been further discovered that the insulation cover 312 having the connection opening 314 over the routing layer 302 formed from the lead-frame and not the substrate structure provides improved yield and lower manufacturing cost. The insulation cover 312 having the connection opening 314 reduces the manufacturing complexity and material necessary to provide protection against shorts and damages to the conductive portions for lead-frames. It has yet further been discovered that the insulation cover 312 having the connection opening 314 only directly under the internal interconnect 320 provides complete protection of the routing layer 302 while maintaining lower manufacturing cost.

It has also been discovered that the conductive land 304 having the overhang portion 311 on the top portion thereof provides improved mold lock capability for the routing layer 302 while maintaining lower manufacturing cost. The overhang portion 311 on the top portion of the conductive land 304 can be a characteristic of shaping the conductive land 304 from the bottom side only instead of from both top and the bottom. The single direction of shaping eliminates the need to separately design the shaping process from an addition direction.

The integrated circuit packaging system 300 can have a top mold surface 330 of the top encapsulation 324 coplanar with a top chip surface 332 of the integrated circuit die 318. It has been discovered that having the top mold surface 330 of the top encapsulation 324 coplanar with the top chip surface 332 of the integrated circuit die 318 provide lower profile height while maintaining structural integrity for the integrated circuit packaging system 300.

Figure 4:
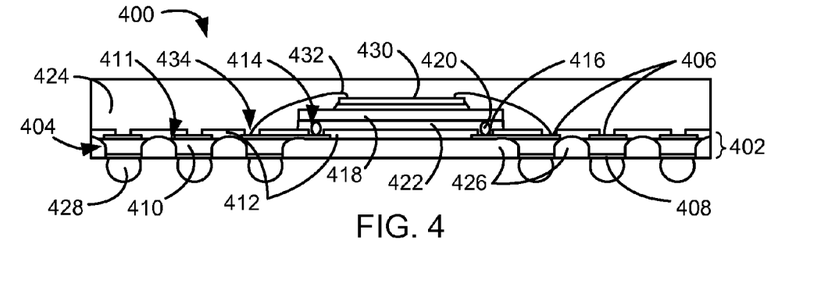
FIG. 4 is a cross-sectional view of an integrated circuit packaging system along a line 1-1 of FIG. 2 in a third embodiment of the present invention.

Referring now to FIG. 4, therein is shown a cross-sectional view of an integrated circuit packaging system 400 along a line 1-1 of FIG. 2 in a third embodiment of the present invention. The integrated circuit packaging system 400 includes a routing layer 402.

The routing layer 402 is defined as a conductive structure used for routing electrical signals, power, ground, or reference potential for the integrated circuit packaging system 400. The routing layer 402 can route the signals within the integrated circuit packaging system 400, between the integrated circuit packaging system 400 and external components or structures, or a combination thereof. The routing layer 402 can have a conductive land 404 and a metal connector 406.

The conductive land 404 is defined as a conductive portion within the routing layer 402 for routing electrical signals, power, ground or any reference potential in a non-horizontal direction. The conductive land 404 can be located on a lower portion of the integrated circuit packaging system 400. The conductive land 404 can extend in a non-horizontal direction. The conductive land 404 can have a bottom cover 408 and a column portion 410.

The bottom cover 408 is defined as an electrically conductive material for interfacing with components or structures external to the integrated circuit packaging system 400. The bottom cover 408 can be directly on a bottom portion of the column portion 410. The bottom cover 408 can also be used to shape and form the conductive land 404. The manufacturing process of the integrated circuit packaging system 400, including shaping and forming of the conductive land 404 will be discussed in more detail below.

The column portion 410 can be made from any number of materials. For example, the column portion 410 can be made from metal, such as copper or aluminum, or an alloy. The column portion 410 can be electrically conductive. The column portion 410 can have a non-horizontal wall connected to a top surface of the column portion 410 or an overhang portion 411 located at a top portion of the column portion 410. The non-horizontal wall and the overhang portion 411 of the column portion 410 can join to form an angle or a concave curve and to provide mold locking features.

For example, the overhang portion 411 can have the top surface of the column portion 410 extending past the non-horizontal wall of the column portion. The top surface and the bottom surface of the overhang portion 411 can join and form an acute or a right angle. The bottom surface of the overhang portion 411 can extend to and be integral with the non-horizontal wall. The bottom surface of the overhang portion 411 can form an obtuse or a right angle with the non-horizontal wall. The bottom surface of the overhang portion 411 can also form a concaved curved surface with the non-horizontal wall.

The metal connector 406 can be directly on a top portion of the conductive land 404. The metal connector 406 can be conductive and extend horizontally for routing electrical signals along a horizontal plane. For example, the metal connector 406 can connect the conductive land 404, another component or structure within the integrated circuit packaging system 400, or a combination thereof. Also, for example, the metal connector 406 can be a trace, a wire, a pad, a connector, or a combination thereof.

The integrated circuit packaging system 400 can have an insulation cover 412. The insulation cover 412 is defined as a non-conductive material for covering the routing layer 402. For example, the insulation cover 412 can be ceramic, solder resist, dielectric structure, or a combination thereof. The insulation cover 412 can be directly on the routing layer 402. The insulation cover 412 can selectively expose only portions of the routing layer 402 necessary for electrically connecting to other components or structures.

The insulation cover 412 can be directly on a top or side portion of the metal connector 406, a top or side portion of the conductive land 404, or a combination thereof. The insulation cover 412 can extend horizontally and over the metal connector 406, the conductive land 404, or a combination thereof. The insulation cover 412 can cover the top portion of the metal connector 406, the top portion of the conductive land 404, or a combination thereof.

The insulation cover 412 can have a connection opening 414 for selectively connecting components or structures to the metal connector 406, the conductive land 404, or a combination thereof. The connection opening 414 of the insulation cover 412 can expose the metal connector 406, the conductive land 404, or a combination thereof from the insulation cover 412. The insulation cover 412 can otherwise partially or completely cover the top portion of the metal connector 406, the top portion of the conductive land 404, or a combination thereof.

The routing layer 402 can have a connection enhancer 416, such as a solder wetable material, in the connection opening 414. The connection enhancer 416 can be on the top portion of the metal connector 406, the top portion of the conductive land 404, or a combination thereof. The connection enhancer 416 can be only on the portions of the metal connector 406, the conductive land 404, or a combination thereof exposed by the connection opening 414.

The integrated circuit packaging system 400 can have an integrated circuit die 418, such as a wire bond die or a flip chip, connected to the metal connector 406 through an internal interconnect 420, such as a bond wire or a solder bump. The integrated circuit die 418 can be attached on the insulation cover 412 and can be over the insulation cover 412, the metal connector 406, the conductive land 404, or a combination thereof. The internal interconnect 420 can be in the connection opening 414 and directly on the integrated circuit die 418, the metal connector 406, the conductive land 404, or a combination thereof.

The integrated circuit packaging system 400 can have an under-fill 422, such as a capillary or a mold type. The under-fill 422 can be between, directly on, or a combination thereof for the integrated circuit die 418, the internal interconnect 420, the insulation cover 412, the metal connector 406, the conductive land 404, or a combination thereof. The under-fill 422 can also be in the connection opening 414.

The integrated circuit packaging system 400 can have a top encapsulation 424, a bottom encapsulation 426, and an external interconnect 428. The top encapsulation 424 can be over, encapsulate, be directly on, or a combination thereof for the integrated circuit die 418, the internal interconnect 420, the under-fill 422, the insulation cover 412, or a combination thereof. The bottom encapsulation 426 can be under the integrated circuit die 418.

The bottom encapsulation 426 can encapsulate and be directly on the conductive land 404 and can be between multiple instances of the conductive land 404. A bottom surface of the bottom encapsulation 426 can be coplanar with a bottom surface of the conductive land 404. The bottom surface of the bottom encapsulation 426 can also be lower than the bottom surface of the conductive land 404 and have the conductive land 404, the bottom cover 408, or a combination thereof in an indentation of the bottom encapsulation 426.

The top encapsulation 424 and the bottom encapsulation 426 can be formed separately at different times during the manufacturing process. The insulation cover 412, the metal connector 406, the conductive land 404, or a combination thereof can form a continuous horizontal plane between the top encapsulation 424 and the bottom encapsulation 426, and isolate the two encapsulation structures.

The integrated circuit packaging system 400 can have the routing layer 402 formed from a lead-frame and not a substrate structure. For example, the integrated circuit packaging system 400 can be without an inner support portion, such as such as a pre-impregnated layer in substrates, or have the routing layer 402 directly on both the insulation cover 412 and the bottom encapsulation 426.

The external interconnect 428 can be a conductive structure for electrically coupling the integrated circuit packaging system 400 to other structures, such as components or other packages. For example, the external interconnect 428 can be a solder ball, conductive posts, lands, or a combination thereof. The external interconnect 428 can be directly on the bottom portion of the conductive land 404.

It has been discovered that the insulation cover 412 directly on the routing layer 402 having the conductive land 404 without any inner support portions, such as the pre-impregnated layer in substrates, provides increased versatility while improving yield and manufacturing cost. The insulation cover 412 directly on the routing layer 402 having the conductive land 404 without any inner support portions enables using lead frames having signal routing mechanisms to manufacture lead-frame grid-array types of packages. The insulation cover 412 further provides protection against shorts and damages to the conductive portions.

It has been further discovered that the insulation cover 412 having the connection opening 414 over the routing layer 402 formed from the lead-frame and not the substrate structure provides improved yield and lower manufacturing cost. The insulation cover 412 having the connection opening 414 reduces the manufacturing complexity and material necessary to provide protection against shorts and damages to the conductive portions for lead-frames. It has yet further been discovered that the insulation cover 412 having the connection opening 414 only directly under the internal interconnect 420 provides complete protection of the routing layer 402 while maintaining lower manufacturing cost.

It has also been discovered that the conductive land 404 having the overhang portion 411 on the top portion thereof provides improved mold lock capability for the routing layer 402 while maintaining lower manufacturing cost. The overhang portion 411 on the top portion of the conductive land 404 can be a characteristic of shaping the conductive land 404 from the bottom side only instead of from both top and the bottom. The single direction of shaping eliminates the need to separately design the shaping process from an addition direction.

The integrated circuit packaging system 400 can have a further die 430, such as a wire bond die or a flip chip, and a further internal-connector 432, such as a bond wire or a conductive post. The further die 430 can be mounted on the integrated circuit die 418. The further die 430 can have horizontal dimensions that are smaller or greater than those of the integrated circuit die 418. The further die 430 can be mounted centered with or off-center from the integrated circuit die 418. A portion of the further die 430 can extend past a periphery edge of the integrated circuit die 418 to create a die overhang portion.

The further internal-connector 432 can be directly on the further die 430, the integrated circuit die 418, the metal connector 406, the conductive land 404 or a combination thereof. The further internal-connector 432 can be connected to the routing layer 402 through the connection opening 414, a further opening 434, or a combination thereof of the insulation cover 412. The further opening 434 can be similar to the connection opening 414 and expose the routing layer 402 from the insulation cover 412. The further internal-connector 432 can be used to relay electrical signals to and from the further die 430.

It has been discovered that the routing layer 402 having the conductive land 404 and the metal connector 406 and the insulation cover 412 having the connection opening 414 provide improved yield in manufacturing lead-frame grid-array type of packages having multiple integrated circuit devices. The combination of the conductive land 404 and the metal connector 406 provide flexibility in locating connection points and routing schemes for signals to multiple devices. The insulation cover 412 having the connection opening 414 prevents shorts and protects connection portions within the package and during manufacturing.

Figure 5:
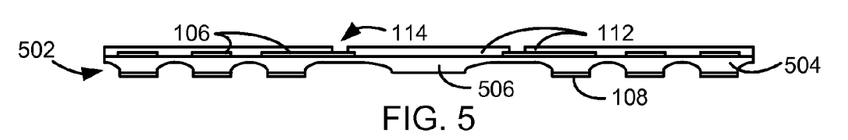
FIG. 5 is a lead-frame for manufacturing the integrated circuit packaging system of FIG. 1.

Referring now to FIG. 5, therein is shown a lead-frame 502 for manufacturing the integrated circuit packaging system 100 of FIG. 1. The lead-frame 502 can be a conductive structure that provides support for various components of the integrated circuit packaging system 100 during the manufacturing process. The lead-frame 502 can be a pre-plated frame and can be initially shaped.

The lead-frame 502 can have the bottom cover 108 and an inner portion 504, with the bottom cover 108 directly on a bottom surface of the inner portion 504. A portion of the inner portion 504 directly on the bottom cover 108 can be designated for forming the conductive land 104 of FIG. 1. The inner portion 504 can be shaped to form the column portion 110 of FIG. 1 in forming the conductive land 104.

The inner portion 504 can be initially shaped, such as through a chemical etching or metal forming process. The inner portion 504 can be shaped to separate the portion of the lead-frame 502 designated for forming the conductive land 104. The lead-frame 502 can be further shaped to complete the formation of the conductive land 104.

The inner portion 504 can also have a planar bottom surface without the initial shaping process. The lead-frame 502 can have the bottom cover 108 directly on the planar bottom surface of the inner portion 504. The further shaping process can form the conductive land 104 without the initial shaping process. The further shaping process will be discussed in more detail below.

The lead-frame 502 can also have a support portion 506. The support portion 506 is defined as a portion of the lead-frame 502 located horizontally between instances of the bottom cover 108 for providing rigidity to the lead-frame 502 during the manufacturing process. The support portion 506 can be below a portion intended for supporting the integrated circuit die 118 of FIG. 1. The support portion 506 can be absent the bottom cover 108 can be removed during the further shaping process described below. It has been discovered that the lead-frame 502 having the support portion 506 prevents bowing damage during manufacturing to improve yield.

The lead-frame 502 can also have a planar surface or a concave surface horizontally between instances of the bottom cover 108. The lead-frame 502 can have the planar or the concave surfaces only between the instances of the bottom cover 108 without the support portion 506.

The lead-frame 502 can have the metal connector 106. The metal connector 106 can be formed directly on a top surface of the inner portion 504. The metal connector 106 can be patterned according to a design for routing the signals along a horizontal plane.

The insulation cover 112 can be formed, such as through lamination or deposition process, on a top surface of the lead-frame 502. The insulation cover 112 can be formed having the connection opening 114. The connection opening 114 can also be formed by removing portions of the insulation cover 112 after a formation process for the insulation cover 112.

For example, the connection opening 114 can be formed by spacers or mold chases used to form the insulation cover 112. Also, for example, the connection opening 114 can be formed by punching or etching the insulation cover 112.

The insulation cover 112 can be formed covering the top surface of the lead-frame 502. The insulation cover 112 can expose the metal connector 106, the inner portion 504, or a combination thereof through the connection opening 114. The insulation cover 112 can also only expose the metal connector 106, the inner portion 504, or a combination thereof through the connection opening 114.

The insulation cover 112 can also be formed completely covering the top surface of the lead-frame 502. The insulation cover 112 can also expose the metal connector 106, the inner portion 504, or a combination thereof only through the connection opening 114.

The lead-frame 502 can have the connection enhancer 116 of FIG. 1 applied in the connection opening 114. Alternatively, the connection enhancer 116 can be integral with the metal connector 106, the inner portion 504, or a combination thereof. The connection enhancer 116 can be on a top surface of the metal connector 106, a top surface of the inner portion 504, or a combination thereof and exposed through the connection opening 114.

Figure 6A:
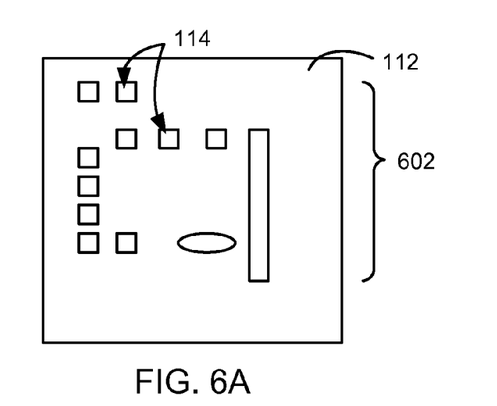
FIG. 6A is an exemplary top view of the lead-frame of FIG. 5.

Referring now to FIG. 6A, therein is shown an exemplary top view of the lead-frame 502 of FIG. 5. The lead-frame 502 can have the insulation cover 112 covering the top portion of the lead-frame 502. The insulation cover 112 can have the connection opening 114 exposing the lead-frame 502.

The connection opening 114 or instances of the connection opening 114 can have a connection pattern 602. The connection pattern 602 can be arranged to expose only the portions of the lead-frame 502 that is designated to connect to a component or a structure. For example, the connection pattern 602 can expose only the portions of the lead-frame 502 designated to connect to a passive component, the internal interconnect 120 of FIG. 1, the further internal-connector 432 of FIG. 4, other wires or conductive structures, or a combination thereof.

The connection pattern 602 can have a regular or patterned shape. For example, the connection pattern 602 can have a shape of a rectangle or an oval for matching locations of connection points on devices. Also, for example, the connection pattern 602 can have instances of the connection opening 114 having shapes of a rectangle or an oval evenly spaced apart along a line or arranged in a shape of a rectangle. For further example, the connection pattern 602 can be customized or irregular to according to a particular design.

It has been discovered that the insulation cover 112 having the connection opening 114 arranged according to the connection pattern 602 prevents shorts and damage to the lead-frame 502. The connection pattern 602 can be arranged to expose only portions of the lead-frame 502 required for connecting to other components or structures and cover other portions to provide protection.

Figure 6B:
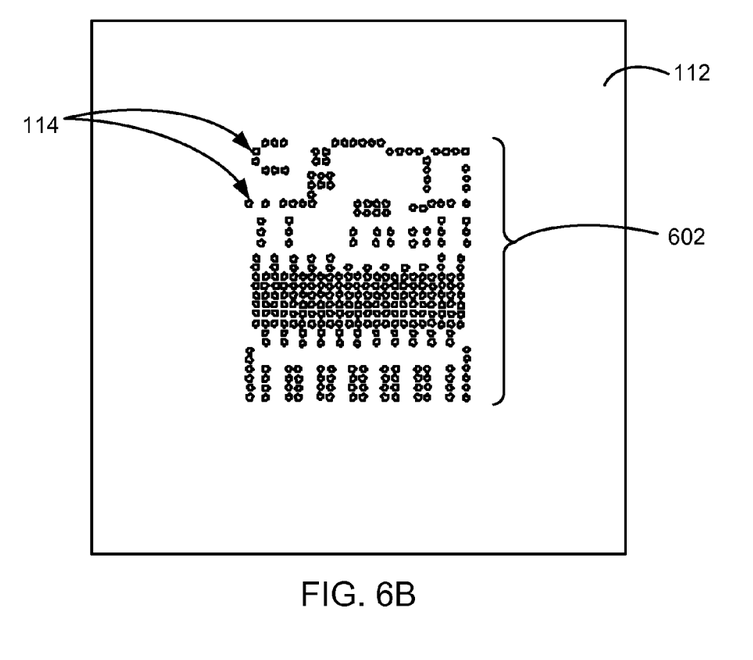
FIG. 6B is a further exemplary top view of the lead-frame of FIG. 5.

Referring now to FIG. 6A, therein is shown a further exemplary top view of the lead-frame 502 of FIG. 5. The connection opening 114 in the insulation cover 112 can have various shapes. For example, the connection opening 114 can have a shape of a polygon or an oval, or have irregular shapes having curved perimeter lines, corners, or a combination thereof.

The connection opening 114 can have a shape characteristic of the forming process. For example, the connection opening 114 can have a shape of an oval or an irregular perimeter shape having curves as a characteristic of etching. Also, for example, the connection opening 114 can have a shape having sharp protruding corners, chips or cracks along the perimeter, or a combination thereof as a characteristic of using a cutting tool to form the connection opening 114.

The connection opening 114 can arranged according to the connection pattern 602. For example, the connection opening 114 can be arranged in a central portion in the insulation cover 112. Also, for example, the connection opening 114 can be arranged in rows or columns, have customized location or spacing, or a combination thereof corresponding to connection locations according to design.

Figure 7:
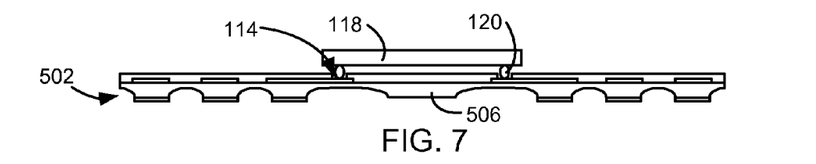
FIG. 7 is the structure of FIG. 5 with the integrated circuit die connected thereon.

Referring now to FIG. 7, therein is shown the structure of FIG. 5 with the integrated circuit die 118 connected thereon. The integrated circuit die 118 can be connected to the lead-frame 502. The integrated circuit die 118 can be connected attached to the lead-frame 502 directly over and overlapping the support portion 506. The integrated circuit die 118 can be directly on the internal interconnect 120, which can be directly on the lead-frame 502.

The lead-frame 502 can also have a planar surface or a concave surface horizontally between instances of the bottom cover 108 of FIG. 1 instead of the support portion 506. The integrated circuit die 118 can be attached to the lead-frame 502 directly over and overlapping the planar or concave surface.

The internal interconnect 120 can be in the connection opening 114 and directly on the lead-frame 502. It has been discovered that the internal interconnect 120 in the connection opening 114 prevents shorts that can be created during the manufacturing process. The connection opening 114 can contain the internal interconnect 120 from moving horizontally during any intended or unintended reflow or reshaping of the internal interconnect 120.

Other components or structures, such as the further die 430 of FIG. 4 or passive components (not shown) can be connected to the lead-frame 502. The other components or structures can also connect in the connection opening 114 and be directly on the lead-frame 502.

Figure 8:
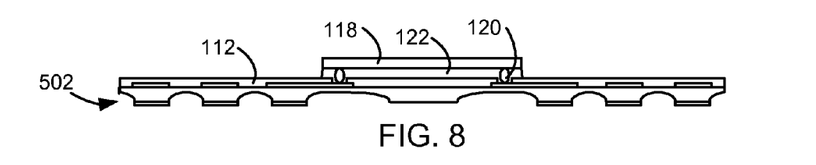
FIG. 8 is the structure of FIG. 7 with the under-fill applied thereon.

Referring now to FIG. 8, therein is shown the structure of FIG. 7 with the under-fill 122 applied thereon. The under-fill 122 can be applied between the integrated circuit die 118, the internal interconnect 120, the lead-frame 502, the insulation cover 112, or a combination thereof. The under-fill 122 can directly contact the integrated circuit die 118, the internal interconnect 120, the lead-frame 502, the insulation cover 112, or a combination thereof.

Figure 9:
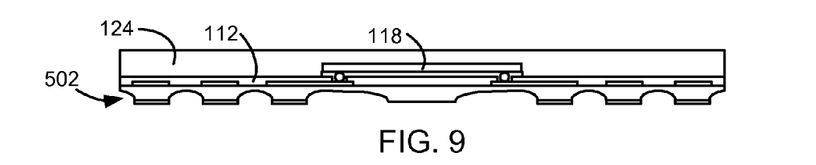
FIG. 9 is the structure of FIG. 8 with the top encapsulation formed thereon.

Referring now to FIG. 9, therein is shown the structure of FIG. 8 with the top encapsulation 124 formed thereon. The top encapsulation 124 can be formed over the lead-frame 502, the insulation cover 112, the integrated circuit die 118, or a combination thereof. The top encapsulation 124 can be directly on the lead-frame 502, the insulation cover 112, the integrated circuit die 118, or a combination thereof. The top encapsulation 124 can completely cover top portions of the lead-frame 502, the insulation cover 112, the integrated circuit die 118, or a combination thereof.

Figure 10:
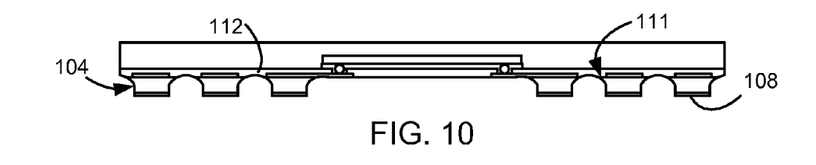
FIG. 10 is the structure of FIG. 9 with the conductive land formed thereon.

Referring now to FIG. 10, therein is shown the structure of FIG. 9 with the conductive land 104 formed thereon. The lead-frame 502 of FIG. 9 can be further shaped to form the conductive land 104. The bottom cover 108 can be used as a mask for the shaping process.

For example, an etching process or a metal shaping process can remove portions of the inner portion 504 of FIG. 5 horizontally between instances of the bottom cover 108. The inner portion 504 can become the column portion 110 of FIG. 1 after the shaping process to form the conductive land 104.

The portions of the lead-frame 502 not having the bottom cover 108 can be removed. For example, the support portion 506 of FIG. 5, other portions horizontally between the bottom cover 108, or a combination thereof can be removed during the shaping process. A bottom surface for a portion of the insulation cover 112 directly under the integrated circuit die 118 of FIG. 1, portions of the insulation cover 112 horizontally between the bottom cover 108, or a combination thereof can be exposed from material remaining from the lead-frame 502, such as the conductive land 104.

The removal of the inner portion 504 can expose the insulation cover 112 between instances of the conductive land 104. The insulation cover 112 between the instances of the conductive land 104 can have a planar surface extending between and surrounding the instances of the conductive land 104. The insulation cover 112 can also form a recess between the instances of the conductive land 104.

The further shaping process can form the overhang portion 111 of the column portion 110. The overhang portion 111 can be a characteristic of shaping the lead-frame 502 from the bottom only, which preserves the top planar surface of the conductive land 104 and extending through the overhang portion 111. Further, the overhang portion 111 can be formed on the top portion of the column portion 110 as a characteristic of shaping the lead-frame 502 from only the bottom.

Figure 11:
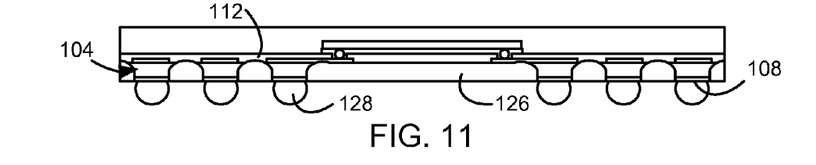
FIG. 11 is the structure of FIG. 10 with the bottom encapsulation and the external interconnect formed thereon.

Referring now to FIG. 11, therein is shown the structure of FIG. 10 with the bottom encapsulation 126 and the external interconnect 128 formed thereon. The bottom encapsulation 126 can be formed directly on the insulation cover 112, the conductive land 104, or a combination thereof.

A bottom surface of the bottom encapsulation 126 can be coplanar with a bottom surface of the bottom cover 108. The bottom surface of the bottom encapsulation 126 can also be below the bottom surface of the bottom cover 108. The external interconnect 128 can be formed directly on the bottom surface of the bottom cover 108 and horizontally between portions of the bottom encapsulation 126.

Figure 12:
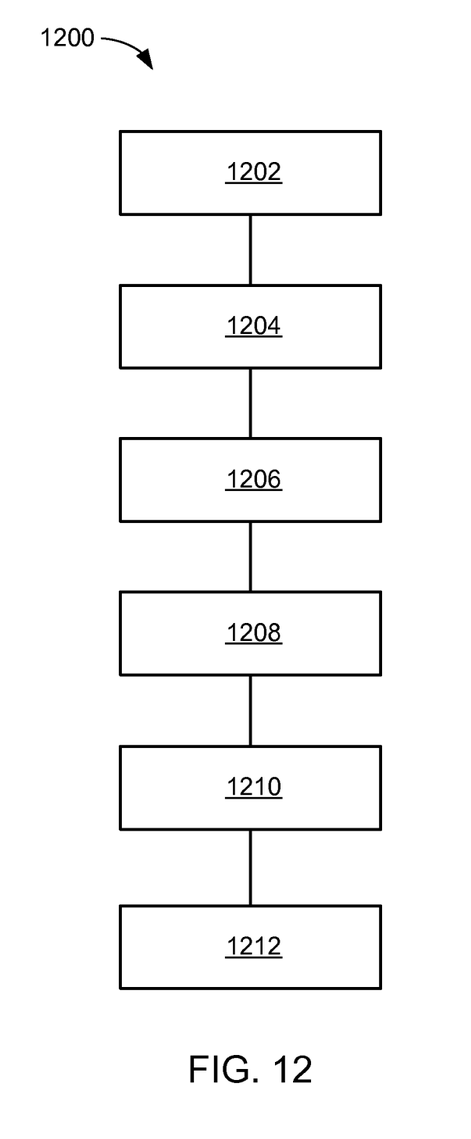
FIG. 12 is a flow chart of a method for manufacture of an integrated circuit packaging system of FIG. 1 in a further embodiment of the present invention.

Referring now to FIG. 12, therein is shown a flow chart of a method 1200 for manufacture of an integrated circuit packaging system 100 of FIG. 1 in a further embodiment of the present invention. The method 1200 includes: providing a lead-frame having an inner portion and a bottom cover directly on a bottom surface of the inner portion in a block 1202; forming an insulation cover directly on the lead-frame with the insulation cover having a connection opening in a block 1204; connecting an integrated circuit die to the lead-frame through the connection opening with the integrated circuit die over the insulation cover in a block 1206; forming a top encapsulation directly on the insulation cover in a block 1208; forming a routing layer having a conductive land directly on the bottom cover by shaping the lead-frame in a block 1210; and forming a bottom encapsulation directly on the conductive land with the bottom cover exposed from the bottom encapsulation in a block 1212.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the integrated circuit packaging system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit packaging system.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A method of manufacture of an integrated circuit packaging system comprising:
   providing a lead-frame having a top surface, an inner portion and a bottom cover directly on a bottom surface of the inner portion;
   forming an insulation cover directly and entirely on the top surface of the lead-frame with the insulation cover having a connection opening and a further opening;
   connecting an integrated circuit die to the lead-frame through the connection opening with the integrated circuit die over the insulation cover;
   connecting a further die to the lead-frame through the further opening with the further die over the integrated circuit die;
   forming a top encapsulation directly on the insulation cover;
   forming a routing layer having a conductive land directly on the bottom cover by shaping the lead-frame; and
   forming a bottom encapsulation directly on the conductive land with the bottom cover exposed from the bottom encapsulation, wherein forming the bottom encapsulation includes forming the bottom encapsulation isolated from the top encapsulation.

2. The method as claimed in claim 1 wherein forming the routing layer includes forming the conductive land having an overhang portion on a top portion of the conductive land.

3. A method of manufacture of an integrated circuit packaging system comprising:
   providing a lead-frame having a top surface an inner portion, a bottom cover, and a metal connector, with the bottom cover and the metal connector directly on opposing surfaces of the inner portion;

forming an insulation cover directly and entirely on the top surface of the lead-frame with the insulation cover having a connection opening and a further opening exposing the lead-frame;

connecting an integrated circuit die to the lead-frame through the connection opening with the integrated circuit die over the insulation cover;

attaching a further die over the integrated circuit die;

connecting a further internal-connector directly on both the further die and the lead-frame through the further opening;

forming a top encapsulation directly on the insulation cover;

forming a routing layer having a conductive land directly on the bottom cover and the metal connector directly on the surface opposing the bottom cover by shaping the lead-frame; and forming a bottom encapsulation directly on the conductive land with the bottom cover exposed from the bottom encapsulation, wherein forming the bottom encapsulation includes forming the bottom encapsulation isolated from the top encapsulation.

4. The method as claimed in claim 3 wherein connecting the integrated circuit die includes connecting an internal interconnect directly on both the integrated circuit die and the lead-frame, with the internal interconnect in the connection opening.

5. The method as claimed in claim 3 wherein connecting the integrated circuit die includes connecting a flip chip to the lead-frame.

\* \* \* \* \*